United States Patent [19]

Sueyoshi

[11] 4,237,426

[45] Dec. 2, 1980

[54] TRANSISTOR AMPLIFIER

[75] Inventor: Susumu Sueyoshi, Tokyo, Japan

[73] Assignee: Pioneer Electronic Corporation, Tokyo, Japan

[21] Appl. No.: 6,717

[22] Filed: Jan. 26, 1979

[30] Foreign Application Priority Data

Jan. 27, 1978 [JP] Japan ............................. 53-8146

[51] Int. Cl.³ .......................... H03F 3/04; H03F 1/32
[52] U.S. Cl. ................................ 330/296; 330/149; 330/277; 330/310; 330/311
[58] Field of Search ............... 330/149, 277, 296, 310, 330/311; 328/162

[56] References Cited

U.S. PATENT DOCUMENTS

| | | |
|---|---|---|
| 3,450,998 | 6/1969 | Greefkes et al. .................... 330/296 |
| 3,619,798 | 11/1971 | Smith et al. ..................... 330/296 X |
| 3,668,539 | 6/1972 | Healey ............................ 330/296 |

*Primary Examiner*—James B. Mullins
*Attorney, Agent, or Firm*—Sughrue, Rothwell, Mion, Zinn and Macpeak

[57] ABSTRACT

A transistor amplifier having a first amplifier circuit with a first transistor having applied to its control electrode an input voltage. The ratio of the output voltage of the first transistor to the input voltage is approximately one. A second transistor circuit has a second transistor with its control electrode being directly supplied with the output voltage of the first transistor. The first and second transistors are bipolar transistors of the same type of conductivity with the respective bases used as the control electrodes.

4 Claims, 6 Drawing Figures

TRANSISTOR AMPLIFIER

BACKGROUND OF THE INVENTION

This invention relates to a transistor amplifier.

A current feedback type grounded emitter amplifier in which the emitter of a transistor is connected to a resistor is a known type of transistor amplifier. Such a transistor amplifier is shown in FIG. 1, where the emitter of a transistor $Q_1$ is connected through a resistor $R_E$ to a negative electric source $-B$. The collector of the transistor $Q_1$ is connected through a collector load resistance $R_C$ to a positive electric source $+B$. An input signal Vi applied to the base is provided as an output $V_O$ at the collector.

If it is assumed that the parameter $h_{FE}$ of the transistor $Q_1$ which is an amplifying element in a circuit 1 is sufficiently high, then the collector current $I_C$ is substantially equal to the emitter current $I_E$. If this current is represented by $I_O$, then the following equation (1) can be established:

$$I_0 = (V_i - V_{BE1})/R_E \tag{1}$$

where, $V_{BE1}$ is the base-emitter voltage of the transistor $Q_1$.

The output voltage $V_O$ can be expressed by the following equation (2):

$$V_O = +B - I_O R_C \tag{2}$$

From the equations (1) and (2), the following equation (3) can be obtained:

$$V_O = (+B - \frac{R_C}{R_E} \cdot V_i) + \frac{R_C}{R_E} \cdot V_{BE1} \tag{3}$$

As indicated in equation (3), the output voltage of the amplifier circuit shown in FIG. 1 includes a so-called distortion component $$\frac{R_C}{R_E} \cdot V_{BE1}$$

in addition to its original output $$(+B - \frac{R_C}{R_E} \cdot V_i).$$

This is due to the non-linearity of the transistor. Since the base-emitter voltage $V_{BE1}$ is in a non-linear relation with the current $I_O$, the amplifier of this type has essentialy this distortion component.

A method of applying negative feedback is known in order to eliminate such a distortion component. However, the application of negative feedback results in the reduction of the amplification degree of the circuit, and accordingly it is necessary to employ a number of amplifying elements to obtain a desired amplification degree to overcome the effects of the negative feedback.

SUMMARY OF THE INVENTION

Accordingly, an object of this invention is to provide a transistor amplifier which is simple in circuit arrangement and is capable of eliminating the distortion component due to the non-linearity of the amplifying element.

It is another object of this invention to provide a transistor amplifier that overcomes the deficiencies of the prior art by providing sufficient amplification without employing a large number of stages.

These and other objects of this invention are accomplished in a transistor amplifier having a first amplifier circuit having a first transistor with its control electrode having the input voltage applied. The ratio of an output voltage of the first transistor to the input voltage is approximately one. A second amplifier circuit has a second transistor with the control electrode thereof receiving directly the output voltage from the output electrode of the first transistor. The first and second transistors are bipolar transistors of the same conductivity type and the control electrodes of said first and second transistors are the base electrodes thereof. The output electrode of the first transistor is the collector electrode. The first amplifier circuit has a collector resistor and an emitter resistor which are connected to the collector and the emitter of the first transistor, respectively, and the resistance of the collector resistor is substantially equal to the resistance of the emitter resistor.

Alternatively first and second transistors are bipolar transistors opposite in conductivity type and the control electrodes of the first and second transistors are the base electrodes thereof. The output electrode of the first transistor is the emitter electrode. The first and second transistors may also be field-effect transistors with the control electrodes of the first and second transistors being the gate electrodes thereof, and the output electrode of said first transistor is the drain electrode. In this configuration, first amplifier circuit has a source resistor and a drain resistor which are connected to the source and the drain of said first transistor, respectively, and the resistance of the source resistor is substantially equal to the resistance of said drain resistor.

Also, in the case where Darlington-connected transistors are used, a first amplifier circuit has a first transistor with an input voltage applied to the base and the ratio of an output voltage provided at the collector of the first transistor to the input voltage being n (n being an integer of two or higher). A second amplifier circuit has a second transitor with the output voltage provided at the collector of the first transistor applied to the base through (n−1) PN junctions. The PN junctions of the (n−1) transistors are base-emitter junctions of mutually connected Darlington connected transistors.

The invention will be described with reference to FIGS. 2 through 6.

BRIEF DESCRIPTION OF THE INVENTION

DESCRIPTION OF THE PREFERRED EMBODIMENTS

Figure 1:
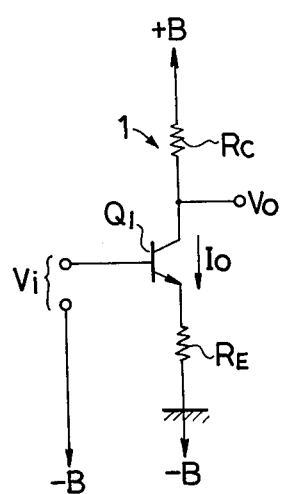
FIG. 1 is a circuit diagram showing one example of a conventional transistor amplifier.
Figure 2:
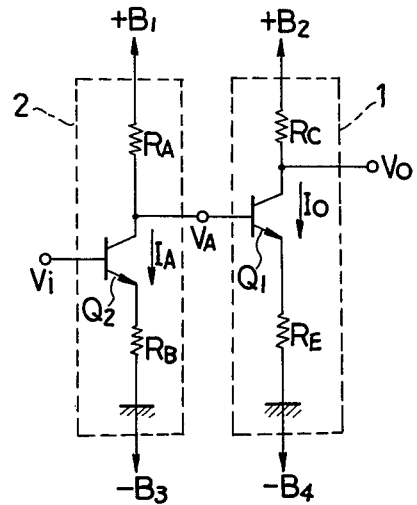
FIG. 2 is a circuit diagram showing a first example of a transistor amplifier according to this invention.

Referring now to FIG. 2, a circuit diagram showing one example of the transistor amplifier according to the invention is shown. In FIG. 2, an amplifier circuit 1 is equal in arrangement to that shown in FIG. 1, but additionally has an inversion amplifier circuit 2 connected thereof. The amplifier circuit 2 has a transistor $Q_2$. The emitter of the transistor $Q_2$ is connected through a resistor $R_B$ to a negative electric source $-B_3$, and the collector thereof is connected through a load resistor $R_A$ to a positive electric source $+B_1$. A circuit input $V_i$ is applied to the control electrode, the base of the transistor $Q_2$, and an output $V_A$ is provided at the output electrode, the collector of the transistor $Q_2$. The output $V_A$ is applied as a control electrode input, or a base input, to the base of the transistor $Q_1$. The positive electric source of the amplifier circuit 1 is designated by $+B_2$.

The output $V_A$ of the front amplifier circuit 2 and the output $V_O$ of the rear amplifier circuit 1 in the circuitry thus organized can be represented by the following equations (4) and (5), respectively:

$$V_A = +B_1 - \frac{R_A}{R_B}(V_i - V_{BE2}) \quad (4)$$

$$V_O = +B_2 - \frac{R_C}{R_E}(V_A - V_{BE1}) \quad (5)$$

From the equations (4) and (5), the following equation (6) can be obtained:

$$V_O = +B_2 - \frac{R_C}{R_E}\{+B_1 - \frac{R_A}{R_B}V_i + (\frac{R_A}{R_B}V_{BE2} - V_{BE1})\} \quad (6)$$

In equation (6), the distortion term is $$(\frac{R_A}{R_B}V_{BE2} - V_{BE1}).$$

It is assumed that the transistors $Q_1$ and $Q_2$ are equal in characteristic to each other, that is, for example they are formed on the same semiconductor chip. When the currents $I_A$ and $I_O$ are equal to each other, the base-emitter voltages $V_{BE1}$ and $V_{BE2}$ of the two transistors are equal to each other. Therefore, the above-described distortion term can be rewritten as $$(\frac{R_A}{R_B} - 1)V_{BE}.$$

If the resistances are selected to be $R_A = R_B$, then the distortion term becomes zero, and the output $V_O$ contains no distortion component. In this case, since it is necessary to make the amount of feedback from resistor $R_B$ equal to that from resistor $R_E$, the resistance of the resistor $R_B$ should be equal to that of the resistor $R_E$ ($R_B = R_E$).

Making the resistance of the resistor $R_A$ equal to that of the resistor $R_B$ in the front amplifier circuit 2 as described above utilizes the amplifier circuit 2 as an amplifier circuit whose voltage gain is one (1). As a result, the distortion component can be eliminated.

Figure 3:
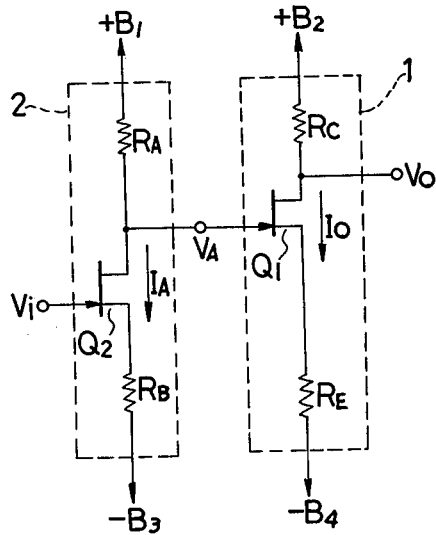
FIGS. 3–6 are circuit diagrams showing second through fifth examples of the transistor amplifier according to this invention.

FIG. 3 is a circuit diagram showing a second example of the transistor amplifier according to the invention. In this amplifier, N channel type field-effect transistors $Q_1$ and $Q_2$ are employed. A circuit input $V_i$ is applied to the control electrode, or the gate of the transistor $Q_2$, and the drain is employed as the output electrode. The output $V_A$ is provided at this drain. This output is applied to the control electrode, or the gate, of the transistor $Q_1$, and the circuit output $V_O$ is provided at the output electrode, or the drain, thereof. If the gate-source voltages $V_{GS}$ of the two transistors are equal to each other and the resistances of the resistors $R_A$ and $R_B$ are also equal to each other, then as in the first example the distortion component can be eliminated from the output $V_O$.

In each of the circuits shown in FIGS. 2 and 3, the resistances of the resistors $R_A$ and $R_B$ are made equal ($R_A = R_B$). Hence the ratio of the input voltage of the front amplifier circuit to its output voltage, namely, the voltage gain is one (1).

Figure 4:
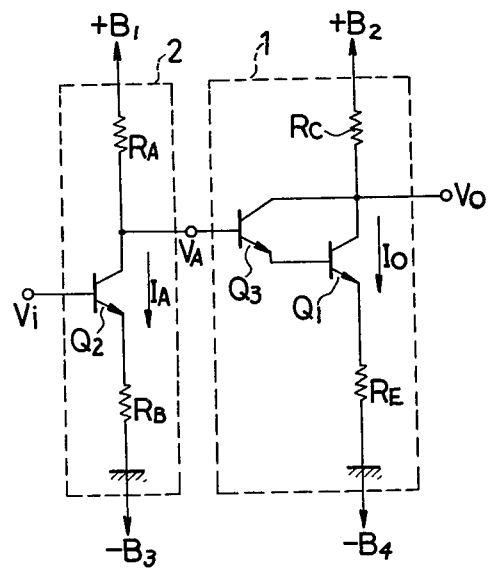

In a third example of the transistor amplifier shown in FIG. 4, the voltage gain of a front amplifier circuit 2 is set to two (2); that is, $R_A/R_B = 2$. A transistor $Q_1$ in a rear amplifier circuit 1 is provided with a transistor $Q_3$ Darlington-connected thereto. The collector output $V_A$ of the transistor $Q_2$ is applied to the base of the transistor $Q_3$. In this case, the output $V_A$ passes the two base-emitter PN junctions of the transistors $Q_3$ and $Q_1$, and therefore the distortion term in the equation (6) is represented by the following expression (7):

$$(\frac{R_A}{R_B} \cdot V_{BE2} - V_{BE3} - V_{BE1}) \quad (7)$$

In this connection, if $R_A/R_B = 2$, and all of the transistors are equal in characteristic to one another, then $V_{BE1} = V_{BE2} = V_{BE3}$. Thus, it is possible to render expression (7) zero.

In general, if the voltage gain of the front amplifier circuit is n (n being an integer of 2 or higher) and $R_A/R_B = n$, then the distortion component can be eliminated by providing the transistor $Q_1$ in the rear amplifier circuit in the form of n stage Darlington-connection. That is, if (n−1) Darlington-connected transistors are provided between the output $V_A$ and the base of the transistor $Q_1$, and the transistor $Q_1$ and the (n−1) Darlington-connected transistors are further Darlington-connected, the output $V_A$ is applied through (n−1) PN junctions to the base of the transistor $Q_1$. Thus, the intended object of elimination of the distortion component can be achieved.

Figure 5:
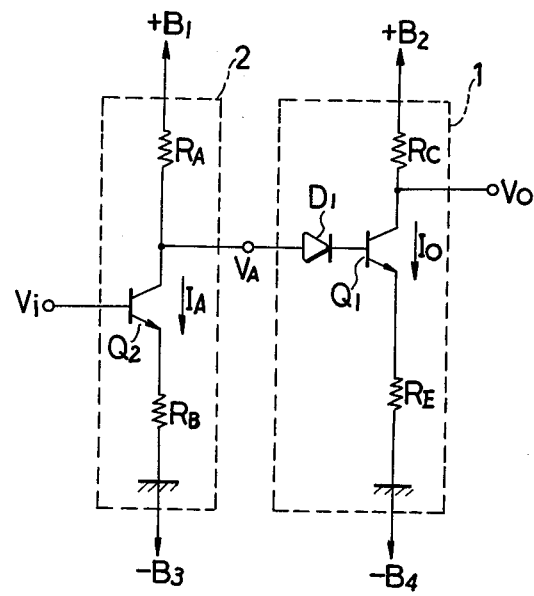

A fourth example of the transistor amplifier according to the invention is shown in FIG. 5. As is clear from the comparison between FIGS. 4 and 5, in the circuit shown in FIG. 5, instead of the use of the Darlington-connected transistor $Q_1$ in FIG. 4 a diode $D_1$ is connected forwardly with respect to the base current of a transistor $Q_1$. This will allow the transistor $Q_1$ to utilize the forward voltage $V_{BED}$ of the PN junction of the diode $D_1$. If the value $V_{BED}$ is made equal to the parameter $V_{BE}$ of the transistor and $R_A/R_B = 2$, then the distortion component can be eliminated.

In this case also, in general, with $R_A/R_B = n$ (n being an integer of 2 or higher) i.e., the gain of the front amplifier 2 being n, it is possible to apply the output $V_A$ to the base of the transistor $Q_1$ through the diodes which are (n−1) PN junctions.

Figure 6:
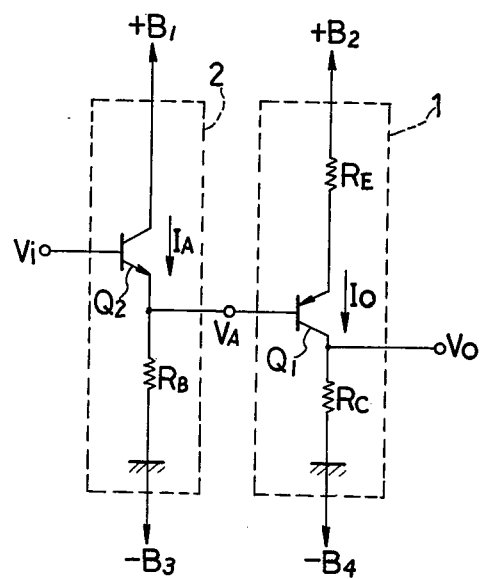

In the above-described examples, the same conductivity type bipolar or field-effect transistors are employed. FIG. 6 shows a fifth example of the transistor amplifier according to the invention, in which bipolar transistors opposite in conductivity type are employed. More specifically, an NPN transistor is employed as a transistor $Q_2$ in the front amplifier circuit 2. The output $V_A$ is obtained at the emitter of the transistor $Q_2$, thus, forming an emitter follower circuit having a voltage gain equal to one. A PNP transistor is employed as a transistor $Q_1$ in the rear amplifier circuit 1. The base of the transistor $Q_1$ is supplied with the output $V_A$ of the front amplifier circuit 2, and the emitter thereof is connected through a resistor $R_E$ to a positive electric source $+B_2$. The circuit output $V_O$ is provided at the collector of the transistor $Q_1$.

With the transistor amplifier thus organized, the following equation (8) is established:

$$\left. \begin{array}{l} V_A = V_i - V_{BE2} \\ V_0 = I_0 R_C \\ +B_2 = I_0 R_E + V_{BE1} + V_A \end{array} \right\} \quad (8)$$

From the equation (8), the following equation (9) can be obtained:

$$V_0 = \frac{R_C}{R_E} \{+B_2 - V_i + (V_{BE2} - V_{BE1})\} \quad (9)$$

In the equation (9) also, $V_{BE2} = V_{BE1}$ can be obtained by making the characteristics of the two transistors $Q_1$ and $Q_2$ equal to each other. Therefore the distortion component can be eliminated by making $R_C = R_E$.

As is apparent from the above description, according to the invention, the distortion due to the non-linearity of the amplifying elements can be eliminated with simple circuitry without the application of feedback. This results in a transistor amplifier having excellent characteristics.

It is apparent that modifications of this invention may be made without departing from the essential scope of the invention.

I claim:

1. A transistor amplifier comprising; a first amplifier circuit having a first transistor, said first transistor having a base supplied with an input voltage, said first transistor having an output voltage wherein the ratio of an output voltage provided at the collector of said first transistor to said input voltage being n, where n is an integer of at least two; and a second amplifier circuit having a second transistor, said second transistor having a base to which said output voltage provided at the collector of said first transistor is applied through (n−1) PN junctions which are connected in series between said collector of said first transistor and said base of said second transistor.

2. A transistor amplifier as in claim 1, wherein said PN junctions are diodes.

3. A transistor amplifier as in claim 1, wherein said PN junctions are the base-emitter PN junctions of (n−1) transistors, said transistors being mutually Darlington-connected, and said (n−1) Darlington-connected transistors and said second transistor being Darlington-connected.

4. A transistor amplifier as in claim 1, 2 or 3, wherein said first amplifier circuit further comprises a collector resistor and an emitter resistor, said resistors connected respectively to the collector and the emitter of said first transistor, and the ratio of the resistance of said collector resistor to the resistance of said emitter resistor is substantially equal to said n.

* * * * *